(12) United States Patent
Seeds et al.

(10) Patent No.: US 7,851,782 B2
(45) Date of Patent: Dec. 14, 2010

(54) PHOTODETECTOR INCLUDING MULTIPLE WAVEGUIDES

(75) Inventors: Alwyn John Seeds, London (GB); Cyril Renaud, London (GB); Michael Robertson, Ipswich (GB)

(73) Assignee: UCL Business PLC, London (GB)

( * ) Notice: Subject to any disclaimer, the term of this patent is extended or adjusted under 35 U.S.C. 154(b) by 0 days.

(21) Appl. No.: 12/295,429

(22) PCT Filed: Mar. 30, 2007

(86) PCT No.: PCT/GB2007/001160

§ 371 (c)(1), (2), (4) Date: Jan. 5, 2009

(87) PCT Pub. No.: WO2007/113502

PCT Pub. Date: Oct. 11, 2007

(65) Prior Publication Data

US 2009/0184383 A1    Jul. 23, 2009

(30) Foreign Application Priority Data

Mar. 31, 2006   (GB)   ................... 0606540.3

(51) Int. Cl.
*H01L 31/00* (2006.01)
*H01L 31/0232* (2006.01)
*G02F 1/025* (2006.01)
*G02B 6/26* (2006.01)
*G02B 6/42* (2006.01)

(52) U.S. Cl. ................ 257/21; 257/432; 257/436; 257/E31.127; 385/1; 385/2; 385/3; 385/39; 385/50

(58) Field of Classification Search ............ 257/21, 257/432, E31.127
See application file for complete search history.

(56) References Cited

U.S. PATENT DOCUMENTS

| 5,818,096 | A | 10/1998 | Ishibashi et al. |
| 6,239,422 | B1 | 5/2001 | Vang et al. |
| 6,278,820 | B1 * | 8/2001 | Hayes ................ 385/39 |
| 6,418,248 | B1 | 7/2002 | Hayes |
| 6,643,309 | B1 * | 11/2003 | Gotoda ............... 372/50.11 |
| 6,740,908 | B1 | 5/2004 | Giboney |

(Continued)

FOREIGN PATENT DOCUMENTS

EP   0 800 219 A2   10/1997

(Continued)

OTHER PUBLICATIONS

Lee et al, "Asymmetric Waveguides Vertical Couplers for Polarization . . .", IEEE Journal of Lightwave Technology, vol. 23, No. 4, Apr. 2005, pp. 1818-1827.

(Continued)

*Primary Examiner*—Marcos D Pizarro
*Assistant Examiner*—Raj Gupta
(74) *Attorney, Agent, or Firm*—Nixon & Vanderhye, PC

(57) ABSTRACT

An example photodetector includes a waveguide structure having an active waveguide comprising an absorber for converting photons conveying an optical signal into charge carriers conveying a corresponding electrical signal; a carrier collection layer for transporting the charge carriers conveying the electrical signal; and a secondary waveguide immediately adjacent to the carrier collection layer, for receiving the photons to be detected, and which is evanescently coupled to the active waveguide.

19 Claims, 3 Drawing Sheets

U.S. PATENT DOCUMENTS

| | | | |
|---|---|---|---|
| 6,831,309 | B2 | 12/2004 | Giboney |
| 2003/0098408 | A1 | 5/2003 | Yasuoka et al. |
| 2003/0174956 | A1* | 9/2003 | Viens ..................... 385/43 |

FOREIGN PATENT DOCUMENTS

| | | |
|---|---|---|
| EP | 1 049 177 | 11/2000 |
| EP | 1 049 177 A2 | 11/2000 |
| GB | 2 253 480 A | 9/1992 |

OTHER PUBLICATIONS

Liao et al, "Investigation of the High Power Integrated Uni-Travelling Carrier and Waveguide . . . ", Conf. Proc. Articles 2003 IEEE. MTT-S Inernational Microwave Symposium Digest (IMS 2003), Philadelphia, USA Jun. 8-13, 2003, vol. 3, pp. 155-158.

Effenberger et al., "Ultrafast, Dual-Depletion Region, InGaAs/InP p-i-n Detector", Journal of Lightwave Technology, vol. 14, No. 8, Aug 1996, pp. 1859-1864.

Hirota et al., "Traveling-wave photodetector for 1.55 μm wavelength fabricated with unitraveling-carrier photodiodes", Applied Physics Letters, vol. 78, No. 24, pp. 3767-3769, Jun. 11, 2001.

Hirota et al., "1.55-μm Wavelength periodic Traveling-Wave Photodetector Fabricated Using Unitraveling-Carrier Photodiode Structures", Journal of Lightwave Technology, vol. 19, No. 11, pp. 1751-1758, Nov. 11, 2001.

Madjar et al., "Design Considerations for a Uni-Traveling Carrier Traveling Wave Photo Detector for Efficient Generation of millimeter Wave and sub-MM Wave Signals", European Microwave Conference CNIT la Defense, Paris, France Oct. 4-6, 2005.

Beling et al., "InP-Based 1.55 μm High-Speed Photodetectors for 80 Gbit/s Systems and Beyond", Transparent Optical Networks, 7th International Conference Barcelona, Catlonia, Spain Jul. 3-7, 2005.

Giboney et al., "Traveling-Wave Photodetector Design and Measurements", IEEE Journal of Selected Topics in Quantum electronics, vol. 2, No. 3, Sep. 1996, pp. 622-629.

Stöhr et al., "GHz and THz InGaAsP Traveling Wave Photodetector", IEEE/LEOS Annual Meeting Conference Proceedings, vol. 2, pp. 422-423, 2002.

Achouche et al., "High Speed and High Responsivity UTC Photodiode Module for >40 Gb/s Optical Receivers", OFC 2004, paper TuM4, 2004.

Campbell et al., "High-Speed Photodetectors", ECOC 2005 Proceedings, vol. 3, Paper We. 3.6.3, pp. 493-496.

Hietala et al., Traveling-Wave Photodetectors for High-Power, Large-Bandwidth Applications, IEEE Transactions on Microwave Theory and Techniques, vol. 43, No. 9, Sep. 1995, pp. 2291-2298.

Giboney et al., "Traveling-Wave Photodetector Theory", IEEE Transactions on Microwave Theory and Techniques, vol. 45, No. 8, Aug. 1997, pp. 1310-1319.

International Search Report for PCT/GB2007/001160 mailed Jun. 4, 2007.

Written Opinion for PCT/GB2007/001160 mailed Jun. 4, 2007.

Madjar et al., "Design Considerations for a Uni-Traveling Carrier Traveling Wave Photo Detector for Efficient Generation of Millimeter Wave and Sub-MM Wave Signals", *European Microwave Conference*, Oct. 2005, pp. 597-600, XP010903352.

Beling et al., "Inp-based 1.55 / spl mu/m high-speed photodetectors for 80 Gbit/s systems and beyond", *Transparent Optical Networks*, Jul. 2005, pp. 303-308, XP010834406.

* cited by examiner

Relative response from 0 to 110 GHz

Responsivity at 110GHz

PHOTODETECTOR INCLUDING MULTIPLE WAVEGUIDES

This application is the U.S. national phase of International Application No. PCT/GB2007/001160 filed 30 Mar 2007 which designated the U.S. and claims priority to British Patent Application No. 0606540.3 filed 31 Mar 2006, the entire contents of each of which are hereby incorporated by reference.

BACKGROUND AND SUMMARY

This invention concerns a photodetector for converting light signals into electrical signals.

There is an increasing demand for photodetectors able to detect efficiently optical signals modulated at frequencies above 40 GHz for applications such as millimetre-wave over optical fibre communication, high data rate optical networking, millimetre-wave and THz signal generation and radio-astronomy.

Conventionally, two main approaches for high speed photodetectors have emerged. One is to match the optical velocity and the electrical velocity in a waveguide photodiode structure in order to overcome the frequency response limitation arising from the device capacitance. Such a travelling wave (TW) structure offers a 3 dB bandwidth of 50 GHz with a responsivity of 0.2 A/W. The second approach is the use of an electron-only transfer structure because the electron transfer is faster than that for holes. An example of this approach is the Uni-Travelling Carrier structures (UTC) in which the electrons act as the only active carriers and determine the photoresponse. This UTC structure allows a 3 dB bandwidth of as high as 310 GHz with 0.07 A/W responsivity. The two techniques have also been combined by coupling a number of individual UTC photodiodes to an optical waveguide, their spacing and electrical interconnection being adjusted in an attempt to match the optical velocity along the waveguide to the electrical velocity of signals travelling along such interconnection, achieving a 115 GHz 3 dB bandwidth and 0.075 A/W responsivity.

However, in realising a high-speed photodetector, there are a number of competing requirements. In a waveguide photodetector, the absorption length for greater than 90% absorption in an absorber such as InGaAs is 3 µm. With a typical waveguide width of 4 µm to 6 µm wide, absorption in such a small area imposes a limit on the saturation power of the photodetector. The natural answer would be to increase the area of the absorber, e.g. by increasing the length of the waveguide. However, any depletion photodetector has an associated electrical capacitance, also known as depletion capacitance. The larger the junction area, the greater the capacitance. With a given load resistance, increased capacitance leads to proportionately lower device bandwidth. For bandwidths below 300 GHz the interaction length with the absorption layer in a waveguide photodetector could be kept sufficiently short (e.g. 10 µm) to have a low parasitic capacitance and still offer adequate responsivity and saturation power (but the maximum length will be limited by the parasitic capacitance of the device). However to obtain higher responsivity and saturation power a longer waveguide absorption section will be required thus increasing substantially the parasitic capacitance of the detector which will strongly limit its bandwidth.

The present invention seeks to alleviate the problem of simultaneously providing high bandwidth, high responsivity and high saturation power in a photodetector.

According to one aspect of the invention there is provided a photodetector comprising:

an active waveguide comprising an absorber for converting photons conveying an optical signal into charge carriers conveying a corresponding electrical signal;

a carrier collection layer for transporting the charge carriers conveying the electrical signal; and a secondary waveguide immediately adjacent to the carrier collection layer, which supports fewer than 5 modes, for receiving the photons conveying the optical signal, and which is evanescently coupled to the active waveguide.

According to a preferred aspect of the invention, fast transport of said charge carriers away from said active waveguide is enabled, for example by using a uni-travelling carrier (UTC) structure.

According to another preferred aspect of the invention the photodetector comprises a travelling wave structure comprising a further waveguide arranged such that the phase velocity of the electrical signal along the further waveguide is substantially matched to the phase velocity of the optical signal in the active waveguide.

The photodetector according to the above aspects of the invention incorporates an extra waveguide in the structure, referred to as the secondary waveguide or equivalently as the passive waveguide. This additional passive waveguide allows for evanescent coupling with the active absorber waveguide, and the design also enables one or both of fast carrier transfer (like in UTC structure) and a travelling wave (TW) structure to be achieved. A travelling wave structure is a structure such that the optical signal travels at a velocity (phase velocity) comparable to that of the electrical signal along the waveguide/electrode.

The secondary waveguide receives the light to be detected, which light may be equivalently referred to herein as photons or electromagnetic radiation. The terms "light" or "photons" used herein do not imply limitation to any particular part of the electromagnetic spectrum, for example the terms are not limited to the visible part of the spectrum, and they explicitly include infrared radiation, near-infrared radiation, mid-infrared radiation, far-infrared radiation, terahertz wave radiation (THz wave) and millimetre wave radiation. The evanescent coupling enabled by the extra waveguide allows for higher saturation power because it increases the length over which absorption takes place, and also increases the responsivity of the detector.

Depending on the parameters of the structure, the evanescent coupling could imply a relatively long waveguide photodetector, and thus a relatively high parasitic capacitance. However, according to one aspect of the invention, the fact that the secondary waveguide is immediately adjacent to the depletion or carrier collection layer means that this can be overcome by matching the optical and electrical phase velocity (Travelling Wave technique). Effectively the capacitance is made part of a transmission line (further waveguide) formed by the capacitance per unit length of the detector and the inductance per unit length of the electrodes. If the travelling wave structure is well designed the main bandwidth limitation of the detector will be the electron transit time through the absorber (active waveguide) and not the capacitance of the device. The use of travelling wave (TW) techniques with evanescent coupling from a secondary waveguide allows the thickness of the absorber, which determines the electron transit time, to be reduced, thus increasing the bandwidth further.

Optionally the secondary waveguide is designed with dimensions so as to support only a few modes such that the detector can realise velocity matched travelling wave operation, so as to avoid the capacitance limitation, in order to reach the highest bandwidth possible while retaining compatibility with the added layer in the structure. For example the secondary waveguide may be single-moded or slightly multi-moded, such as supporting 2 or 3 modes, while remaining within the scheme of an evanescently coupled device.

The photodetector according to another aspect of the invention is designed to enhance the intrinsic bandwidth of the material by using structure-optimised fast carrier travel (such as a Uni Travelling Carrier structure, for example utilising only electron transport across the depletion or carrier collection region) thus offering a shorter transit time, i.e. charge carriers generated in the absorption layer are rapidly transported away.

According to a further aspect of the invention, mode converters are used to couple light more efficiently from a fibre into the secondary passive waveguide. The device according to the invention has the advantage that the coupling can be optimised without changing the parameters of the active part of the photodetector because of the use of the secondary passive waveguide. A polarisation-independent detector can also be fabricated through the use of an appropriately designed mode converter.

BRIEF DESCRIPTION OF THE DRAWINGS

Embodiments of the present invention will now be now described, by way of example only, with reference to the accompanying drawings, in which.

DETAILED DESCRIPTION OF EXAMPLE EMBODIMENTS

Figure 1:
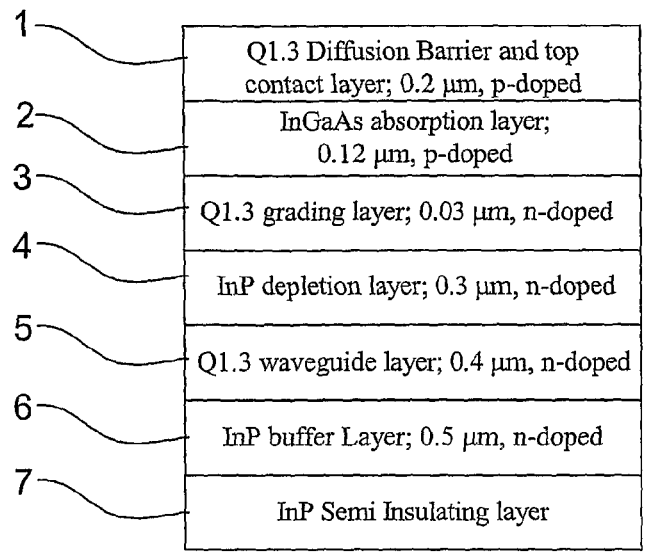
FIG. 1 shows schematically a typical epitaxial design for a photodetector according to an embodiment of the invention.

An example of a UTC epitaxial design for a photodetector according to an embodiment of the invention is shown in FIG. 1. It comprises the following layers from top to bottom: a p-doped Q1.3 diffusion barrier 1 to block the electrons and which is also the top contact layer; a p-doped InGaAs absorption layer 2 (which in the final device constitutes the active waveguide); an n-doped Q1.3 grading layer 3 which blocks the holes; an n-doped InP depletion layer which constitutes a carrier collection layer 4; an n-doped Q1.3 waveguide layer 5 (which in the final device constitutes the added passive secondary waveguide); an n-doped InP buffer layer 6; and a semi-insulating substrate 7. Other layers, such as a p-doped InGaAs top contact layer, may optionally be added above barrier layer 1. Note that Qx.x denotes a quaternary material (in this case InGaAsP) with a bandgap corresponding to an intrinsic absorption edge at a wavelength of x.x µm (in this embodiment 1.3 µm). Depending on the strain in the material, the bandgap defines the proportion of Indium, Gallium, Arsenic and Phosphorus in the quaternary material.

The choice of the materials and dimensions of some of the layers will now be explained. The bandwidth BW of a travelling wave detector according to an embodiment of the invention can be described, to a first order approximation, by the following equation:

$$\frac{1}{BW} = \frac{3 \cdot \pi}{\Gamma \cdot \alpha \cdot v_e} + \frac{d_d}{0.55 \cdot v_d}$$

Where $\Gamma$ is the confinement factor, $\alpha$ is the absorption coefficient, $v_e$ is the electrical phase velocity, $d_d$ is the absorption region thickness and $v_d$ is the uniform electron drift velocity. There is no limitation due to parasitic capacitance because the first term of the equation (the travelling wave term) replaces the parasitic capacitance limitation. The second term is the carrier drift velocity limitation which is optimised in the structures proposed here as embodiments of the invention. The travelling wave term is dependent on the structure and device design. The structure will determine capacitance and conductance of the equivalent circuit for the device as well as the optical coupling characteristic. In a device embodying the invention, the secondary waveguide is placed adjacent to the depletion or carrier collection layer in order to retain control of the capacitance, resistance and the optical coupling. The device design will determine the series resistance and inductance (dependent of the width of the waveguide and the type of contact). Finally the parallel resistance is determined by the material, and the spacing of the electrodes. The control on the capacitance, resistance and the optical coupling in conjunction with the last term enables one to obtain velocity match at high frequency. Typically it implies that the combined thickness of the layers above the layer or layers comprising the secondary passive waveguide layer and the secondary passive waveguide layer itself should be between 0.9 µm and 1.3 µm for typical levels of doping, and typical InGaAsP/InP structures. This thickness includes: layer or layers comprising the secondary passive waveguide layer which should be between not greater than 0.5 µm, preferably between 0.05 µm and 0.5 µm, more preferably between 0.25 µm and 0.5 µm, for efficient coupling of the incident light and efficient evanescent coupling; the absorption layer which should be between 0.03 µm and 0.3 µm for both high intrinsic bandwidth and efficient evanescent coupling; and the layers in between which should be between 0.15 µm and 0.35 µm for efficient evanescent coupling, appropriate capacitance per unit length and short carrier transit time.

One aspect of a UTC detector (the invention is embodied as a UTC detector according to one aspect) is that its speed is enhanced over that of an ordinary PIN diode by using only a single fast carrier type (electron) in the charge transport (holes with a low velocity do not contribute). Electrons are faster than holes at thermal equilibrium and can travel short distances ballistically, i.e. faster than thermal equilibrium saturated velocity. With a suitable bias applied to the device the electrons can travel at up to 6 times their thermal equilibrium velocity.

In order to enable fast carrier transport by UTC operation to be achieved, the photon absorption layer 2 and carrier collection layer 4 are arranged to be separate. The absorption layer 2 is highly p-doped, and electrons generated drift to the low doped depletion layer comprising the carrier collection layer 4 where they are accelerated away. The interface between the absorber layer 2 and depletion or carrier collection layer 4 is very important because it should not enhance recombination or impede the flow of electrons (as would occur as a result of any heterobarrier). Conventionally an abrupt transition between highly doped absorption layer and low doped depletion or carrier collection layer has been achieved using a dopant such as beryllium in the absorber layer, because this has a low diffusion coefficient, and the elimination of a heterobarrier by use of a quaternary grading layer between the absorption and collection layers. In this description, the terms depletion layer and carrier collection layer are generally used synonymously. A depletion layer is an example of a layer that provides the function of carrier collection.

It might be expected that zinc would not be a suitable dopant, because it is known to have a very high diffusion coefficient. However, in some embodiments of this invention, it has been found that zinc is a very suitable dopant, because it is less soluble in InP than InGaAs, and even less soluble in sulphur doped InP. FIG. 1 shows a structure using light sulphur doped InP ($10^{16}$ cm$^{-3}$) for the depletion or carrier collection layer 4, an n-doped Q1.3 layer for the grading layer 3, and highly Zn-doped (>$2\times10^{18}$ cm$^{-3}$) InGaAs for the absorption layer 2. During growth a very limited amount of zinc diffusion takes place through the Q1.3 layer into the InP. This actually reduces any residual heterobarriers between InGaAs and Q1.3, and Q1.3 and InP. This results in the desired high speed UTC devices with high quantum efficiency.

Figure 2:
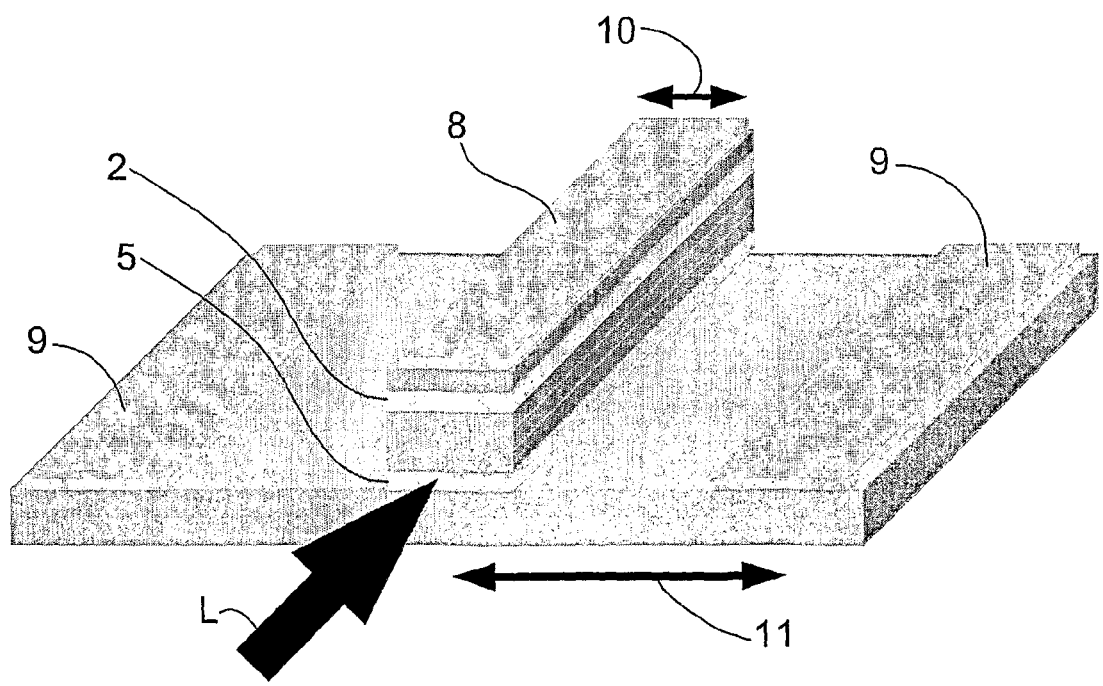
FIG. 2 shows a typical travelling wave structure for a photodetector according to an embodiment of the invention.

FIG. 2 shows a typical travelling wave structure for a photodetector embodying the invention. After the layered structure depicted in FIG. 1 has been grown, for example by epitaxy, it is then processed, for example by etching, to define the width and length of the layers of the device such that the absorption layer 2 constitutes an active waveguide, and the Q1.3 waveguide layer 5 constitutes a secondary, passive waveguide, as shown on the substrate in FIG. 2. For example, the waveguide width may be 4 to 6 μm, and the length 15 μm or more. Metal is also deposited using conventional lithographic techniques to provide a top p-type contact 8, and a pair of n-type contacts 9. In this structure, the electrical and optical phase velocity are matched in order to overcome the limitation of the parasitic capacitance for the electrical bandwidth. The travelling wave structure is defined by the spacing of the electrodes which can be calculated from the characteristics of the detector material and the metal deposition used for contact. Therefore to define the travelling wave device one will typically have to define the type of p-contact 8, the type of n-contact 9, the width 10 of the waveguide and the spacing 11 of the electrodes.

In this embodiment of the invention, the material of the contacts 8 and 9 would be gold or alloys containing gold as a principal component, such as Ti—Au, Pt—Au, Cr—Au, or any suitable material giving ohmic (non-rectifying) contacts to the underlying semiconductor material. The centre electrode 9 would be in the range of 2 to 8 μm wide; the side electrode width would be >5 μm, and the inter-electrode spacing 11 would be from 5 to 25 μm typically). The thickness of the contacts 8,9 is between 300 nm and 800 nm In use, the incoming light L is coupled into the secondary passive waveguide 5 to then be evanescently coupled into the active waveguide (absorption layer) 2.

Figure 3:
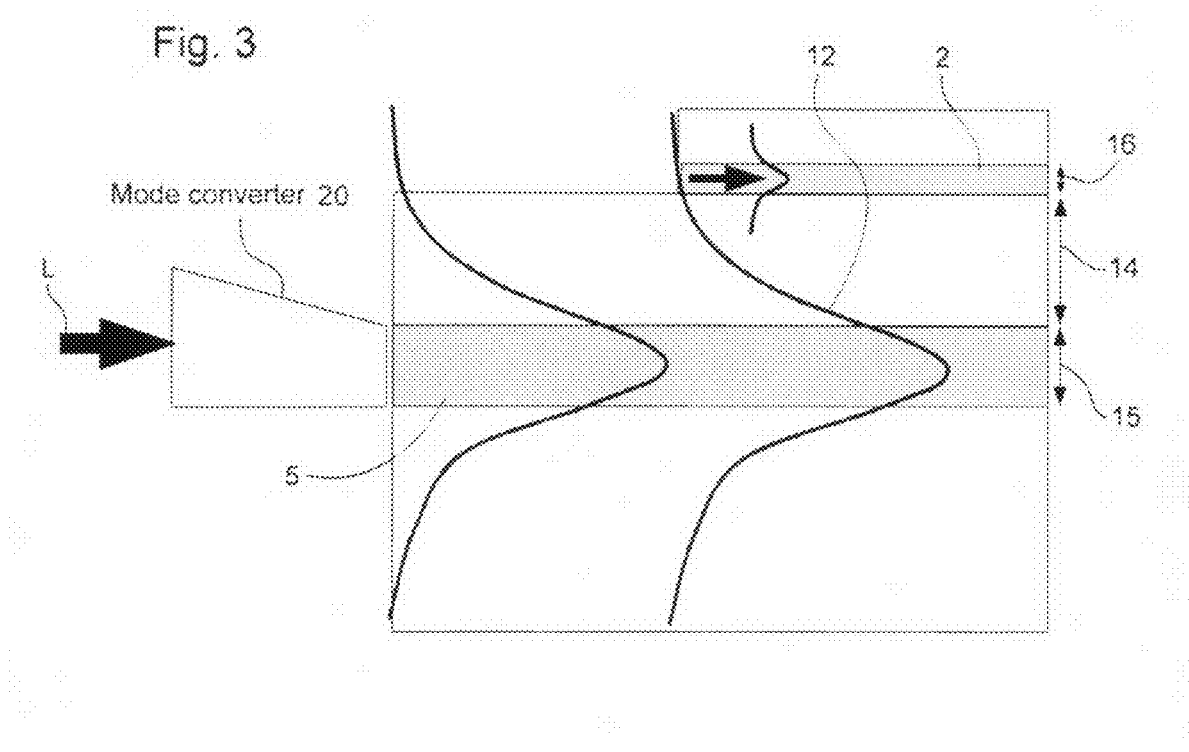
FIG. 3 is a schematic illustration explaining the evanescent coupling used in the invention.

FIG. 3 shows a schematic cross-section describing evanescent coupling between the secondary passive waveguide 5 and the active waveguide 2. The light is coupled from the passive waveguide to the active waveguide through the interaction of the evanescent field 12 of the mode(s) in the passive waveguide 5 with the active waveguide 2. The length over which the light is substantially absorbed (e.g. 90% absorbed) into the passive waveguide depends on the spacing 14 between the two waveguides 2,5, the thickness 15 of the passive waveguide 5, the thickness 16 of the active waveguide 2, and the absorption coefficient of the material of the active waveguide. The secondary waveguide in this embodiment of the invention is designed to support one or only a few guided modes in order to enhance the coupling length and the homogeneity of the coupling. The number of modes is determined by the width and thickness of the waveguides as well as the difference of refractive indexes between the core and the cladding (surrounding material). The refractive index is dependent on the material, and in the case of InP is 3.17 and for Q1.3 is about 3.4. These materials are chosen to enable good detection, therefore the dimensions of the waveguide can be chosen to achieve the desired performance. The width of the secondary waveguide is determined by the width of the active waveguide (absorption layer) which needs to be relatively small to reduce the device capacitance; for example in the range of from 1 to 8 μm. Thus the thickness of the secondary waveguide is the principal free parameter for defining a waveguide supporting only one or a few modes, and in the structure according to this embodiment, the thickness is selected to be not greater than 0.5 μm, preferably in the range of from 0.05 to 0.5 μm, more preferably in the range of from 0.25 to 0.5 μm.

Figure 4:
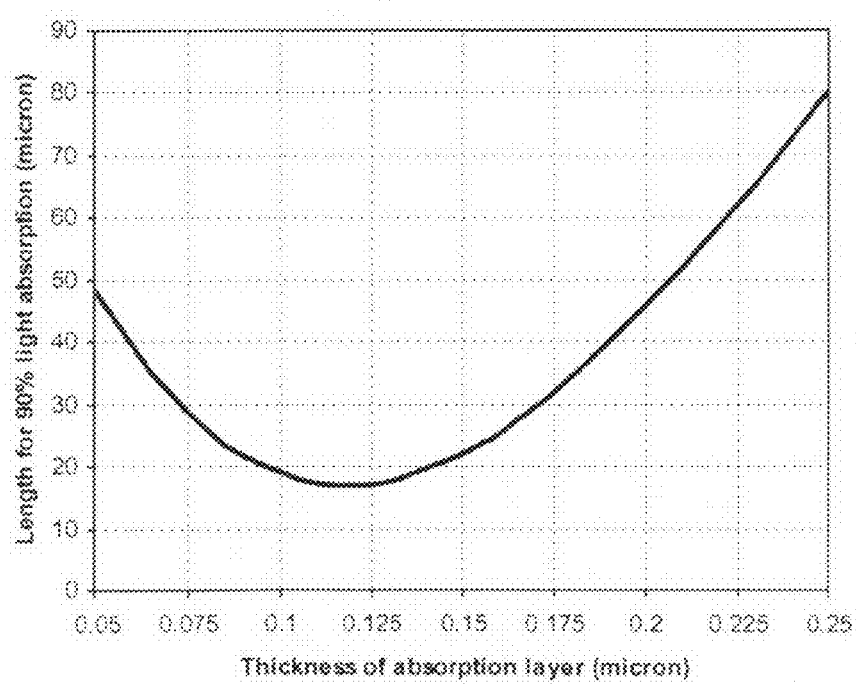
FIG. 4 illustrates evanescent coupling and is a graph of length of waveguide required for 90% absorption against thickness of the absorption layer in a device according to an embodiment of the invention.

FIG. 4 shows the result from two dimensional simulations for an evanescent coupled detector where the detector is as in FIGS. 2 and 3 with the other parameters being: 4 μm for the width 10 of the waveguide 2, thickness 15 of the passive waveguide of 0.4 μm, spacing 14 between the waveguides of 0.33 μm, and the thickness 16 of the active waveguide ranging from 0.05 μm to 0.25 μm, although this thickness is not critical provided it is thick enough to give small contact resistance and the change in contact resistance, inductance and parasitic capacitance is taken into account in designing the device. The graph shows the length of the waveguide necessary to absorb 90% of the incoming light as the thickness of the active waveguide (absorption layer 2) is varied.

An additional tapered waveguide 20, functioning as a mode-converter, can be provided to couple light efficiently from a cleaved optical fibre into the secondary passive waveguide 5. The mode-converter waveguide can also be of the design that makes the device polarisation independent. Further details regarding suitable mode-converters and polarization independence can be gleaned from Chee-Wei Lee, Mee-Koy Chin, Mahadevan K. Iyer, and Alexandre Popov, "Asymmetric Waveguides Vertical Couplers for Polarization-Independent Coupling and Polarization-Mode Splitting", Journal of Lightwave Technology, vol. 23, pp. 1818-1827, 2005.

FIG. 4 shows the importance of the absorption layer thickness (i.e. the thickness 16 of the active waveguide 2), as it plays an important role in the determination of the absorption length. One can notice that reducing the thickness of the absorption layer implies a shorter absorption length until a value (in this case around 0.12 μm thick) at which the absorption length starts to increase again on further reduction in thickness of the absorption layer. A longer absorption length is desirable to extract all the advantages of using a travelling wave structure. However, achieving this at reduced thickness has the further advantage of increasing the intrinsic bandwidth because the electrons will have less distance to travel. Therefore the absorption layer 2 typically has a thickness of less than 0.1 μm. This also increases the parasitic capacitance, but in the device embodying one aspect of the present invention this can be overcome by the use of the travelling wave structure.

Figure 5A:
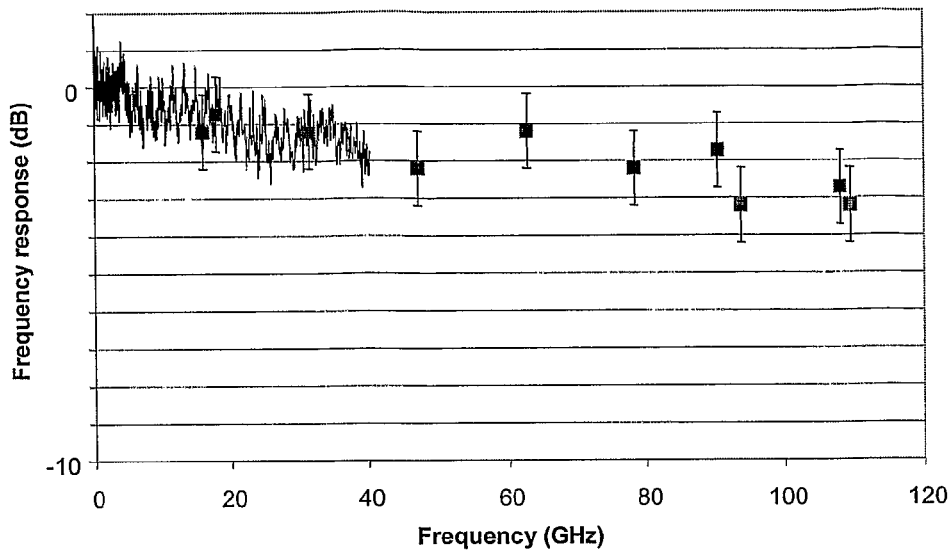
FIGS. 5a and 5b show two graphs of results obtained with a device embodying the invention.
Figure 5B:
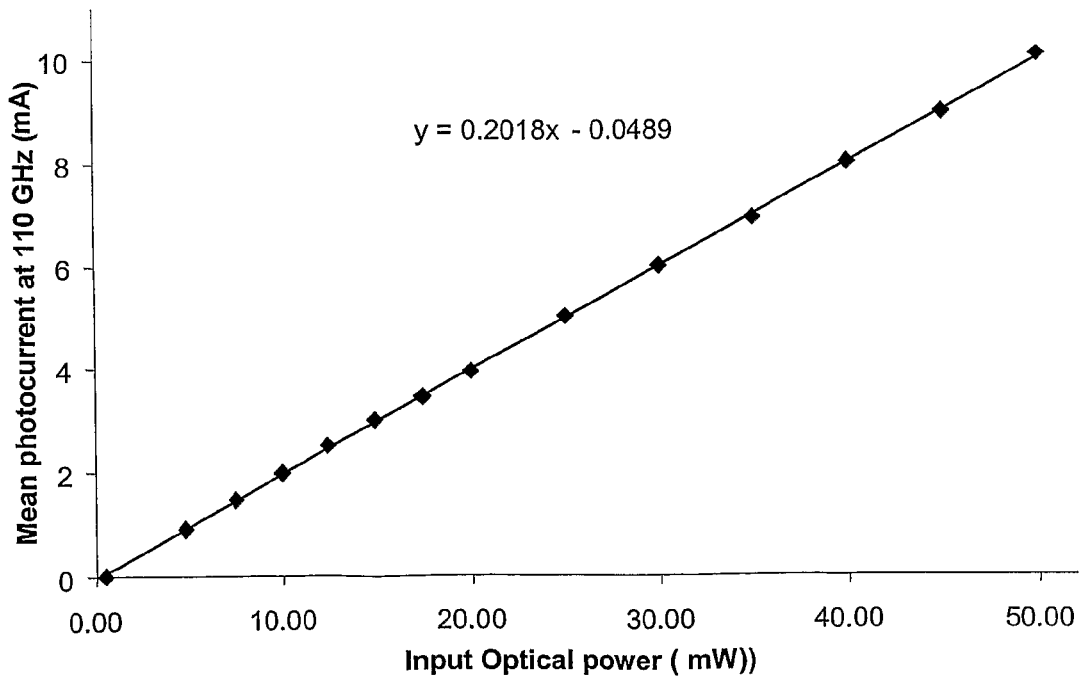

FIGS. 5a and 5b show results obtained from a sample photodetector device embodying the invention. Note that in this case only 40% of the incoming light from a single mode fibre could be coupled into the photodetector. One can see that this non-optimized device already offers a high 3 dB bandwidth as seen on the graph of FIG. 5a of more than 110 GHz, and a high responsivity of 0.2 A/W at 110 GHz as seen in the graph of FIG. 5b. This device has a 15 µm long active waveguide in which the light is absorbed, limiting the saturation power, yet already achieves a saturation power of more than 100 mW. The saturation power can be enhanced further by the use of longer active waveguides.

We claim:
1. A photodetector comprising:
   an active waveguide comprising an absorber for converting photons conveying an optical signal into charge carriers conveying a corresponding electrical signal;
   a carrier collection layer for transporting the charge carriers conveying the electrical signal; and
   a secondary waveguide immediately adjacent to the carrier collection layer, which supports fewer than 5 modes, for receiving the photons conveying the optical signal, and which is evanescently coupled to the active waveguide.
2. A photodetector according to claim 1, wherein fast transport of said charge carriers away from said active waveguide is enabled.
3. A photodetector according to claim 1, wherein the photodetector comprises a travelling wave structure comprising a further waveguide arranged such that the phase velocity of the electrical signal along the further waveguide is substantially matched to the phase velocity of the optical signal in the active waveguide.
4. A photodetector according to claim 1, wherein the secondary waveguide is within an intentionally doped layer of an epitaxial structure.
5. A photodetector according to claim 1, wherein the width of the secondary waveguide is in the range of from 1 to 8 µm.
6. A photodetector according to claim 1, wherein the active waveguide comprises a semiconductor doped with zinc.
7. A photodetector according to claim 1, wherein the active waveguide comprises InGaAs.
8. A photodetector according to claim 1, wherein the active waveguide thickness is less than 0.1 µm.
9. A photodetector according to claim 1, wherein the secondary waveguide comprises n-type InGaAsP.
10. A photodetector according to claim 1, wherein said carrier collection layer comprises an InP depletion layer between the active waveguide and secondary waveguide.
11. A photodetector according to claim 1, wherein the active waveguide and secondary waveguide are at least 15 µm long.
12. A photodetector according to claim 1, further comprising a mode converter for coupling photons to be detected from an optical fibre into the secondary waveguide.
13. A photodetector according to claim 12, wherein the mode converter provides coupling with a polarisation sensitivity of less than 3 dB.
14. A photodetector according to claim 12, wherein the mode converter provides coupling with a polarisation sensitivity of less than 1 dB.
15. A photodetector according to claim 1, comprising a uni-travelling carrier structure for charge carrier transport from the active waveguide.
16. A photodetector according to claim 15, wherein the structure is layered and where the total thickness of the layers comprising the active waveguide, the secondary waveguide, and any intervening layers combined is in the range of from 0.9 µm to 1.3 µm.
17. A photodetector according to claim 16, wherein the secondary waveguide layer thickness is not greater than 0.5 µm.
18. A photodetector according to claim 16, wherein the active waveguide layer thickness is in the range of from 0.03 µm to 0.3 µm.
19. A photodetector according to claim 16, wherein the thickness of the intervening layers is in the range of from 0.15 µm to 0.35 µm.

* * * * *